United States Patent [19]
Inaba

[11] Patent Number: 5,759,417
[45] Date of Patent: Jun. 2, 1998

[54] FLEXIBLE CIRCUIT BOARD AND PRODUCTION METHOD THEREFOR

[75] Inventor: Masaichi Inaba, Ushiku, Japan

[73] Assignee: Nippon Mektron, Ltd., Tokyo, Japan

[21] Appl. No.: 724,080

[22] Filed: Sep. 30, 1996

[30] Foreign Application Priority Data

Oct. 3, 1995 [JP] Japan .................. 7-279726

[51] Int. Cl.$^6$ .................................. H01B 13/22
[52] U.S. Cl. .................. 216/18; 427/96; 427/97; 430/312; 430/315; 430/319
[58] Field of Search .................. 427/96, 97, 98, 427/99; 438/108, 613, 614, 343; 361/767, 771, 779; 174/254; 430/312, 315, 319; 216/18

[56] References Cited

U.S. PATENT DOCUMENTS 4,604,160  8/1986  Murakami et al. .............. 156/630
5,448,020  9/1995  Pendse ........................... 174/250

Primary Examiner—Shrive P. Beck
Assistant Examiner—Timothy Meeks
Attorney, Agent, or Firm—Alix, Yale & Ristas, LLP

[57] ABSTRACT

A desired circuit wiring pattern is formed by forming by plating means a conductive layer having excellent resistance at least to an etching solution on a metal layer which is removed in the post-process by etching means using a resist layer. A surface protective layer having a hole for exposing part of the circuit wiring pattern is formed on both sides of the circuit wiring pattern at a predetermined position as an external connection terminal portion. The circuit wiring pattern can be formed in multiple layers by coating the conductive layer with a circuit wiring layer of another conductive material and a bump is formed to fill the hole as required.

8 Claims, 2 Drawing Sheets

FLEXIBLE CIRCUIT BOARD AND PRODUCTION METHOD THEREFOR

BACKGROUND OF THE INVENTION

1. Field of the Invention

This invention relates generally to a flexible circuit board and a production method therefor and, more specifically, to a flexible circuit board having external connection terminal portions, formed as a land or bump, for electrical connection to various electric or electronic parts and a production method therefor.

2. Description of the Related Art

Flexible circuit boards are now widely used in various fields as wiring means suitable for use in electronic devices and the like. Particularly, a prior art technique for producing a flexible circuit board having fine i.e., precisely defined and located, external connection terminal portions, is shown in FIG. 2.

As shown in FIG. 2a, a desired circuit wiring pattern 23 is first formed on one side of an appropriate flexible insulating base material 20 and a metal mask 21, required for the step of removing part of the insulating base material 20, is formed on the other side of the insulating base material 20. A hole 22 is suitably formed in the metal mask 21 by photoetching at a position corresponding to a predetermined portion of the circuit wiring pattern 23.

An adhesive 24 is used to adhere an appropriate insulating film 25 to the exposed side of the circuit wiring pattern 23 to form a surface protective layer. At the time of the formation of this surface protective layer, as shown in FIG. 2a, a predetermined portion of the circuit wiring pattern 23 is exposed to form a hole 26. The surface protective layer may be produced by photolithography, which uses an appropriate photosensitive resin material, as an alternative to the employment of adhesive 24 and the insulating film 25. In either case, conductive hole 26 can be formed finely with high accuracy.

Then, as shown in FIG. 2b, an excimer laser beam is irradiated from the side of the metal mask 21 to remove, by ablation, a portion of the flexible insulating base material 20 located at the position of the hole 22. This step produces a hole 27 which exposes part of the surface of the circuit wiring pattern 23.

Thereafter, as shown in FIG. 2c, while the surface of the circuit wiring pattern 23 exposed on the bottom of the hole 27 is suitably protected, the unnecessary metal mask 21 is removed by etching means. Next, as shown in FIG. 2d, the holes 26 and 27 are filled with a conductive material such as copper, for example by plating, whereby bumps 28 and 29, first ends of which are electrically connected with predetermined portions of the circuit wiring pattern 23 and the other ends of which project outward suitably, are formed.

The above-described production method for a flexible circuit board employs a double-side copper laminated sheet as the base material for forming a desired circuit wiring pattern 23 and metal mask 21 on respective sides of a flexible insulating base material 20. Such double-side copper laminated sheets are generally expensive.

Also, for forming the conductive hole 27 at a precisely predetermined position of the circuit wiring pattern 23, an excimer laser must be used. Such lasers are extremely expensive and it is therefore very difficult to provide this type of flexible circuit board, having fine external connection terminal portions, at a low cost.

SUMMARY OF THE INVENTION

It is an object of the present invention to provide a flexible circuit board which has land- or bump-shaped fine terminal portions, for external connection at predetermined positions on both sides of a circuit wiring pattern, and has a structure that allows for low-cost production thereof. The present invention also encompasses a production method therefor for such an improved and reduced cost circuit board.

To this end, the method for producing a flexible circuit board according to the present invention comprises the steps of:

forming a resist layer, which defines a desired circuit wiring pattern on one side of a layer comprised of a metal which can be removed by chemical etching;

forming a circuit wiring pattern on the exposed surface of the metal layer, on the side of the resist layer, by providing a layer of a conductive material having resistance to an etching solution which will react with the metal layer;

removing the resist layer;

forming, over the circuit wiring pattern, a surface protective layer having at least a first hole through which a predetermined portion of the circuit wiring pattern is exposed;

removing the metal layer by etching;

forming another surface protective layer, having at least a first hole through which a predetermined portion of the other side of the circuit wiring pattern is exposed; and forming exposed terminals on both sides of the circuit wiring pattern at the positions of the holes.

The step of forming a circuit wiring pattern may include providing a layer of another conductive material on the first conductive layer.

The step of forming terminals may include filling the holes with conductive material, for example by plating, to produce connector bumps which extend outwardly from the flexible circuit.

Each of the surface protective layers is preferably formed with high accuracy by a photolithography process which uses a photosensitive resin material.

In a flexible circuit board in which both sides of a circuit wiring pattern are covered by a surface protective layer, by employing the above described technique, it is easy to provide land-shaped exposed terminal portions for external connection at the positions of holes formed in the surface protective layers, and by filling the holes with a conductive material, it is possible to constitute with ease a flexible circuit board having an external connection bump structure which can mount an electronic part such as a bare semiconductor chip.

DESCRIPTION OF THE PREFERRED EMBODIMENT

The present invention is described hereinafter in more detail with reference to an embodiment of the present invention shown in the accompanying drawings. FIGS. 1a to 1f schematically illustrate the production steps for a flexible circuit board having precisely defined, exposed terminal portions for external connection according to the present invention.

Figure 1A:
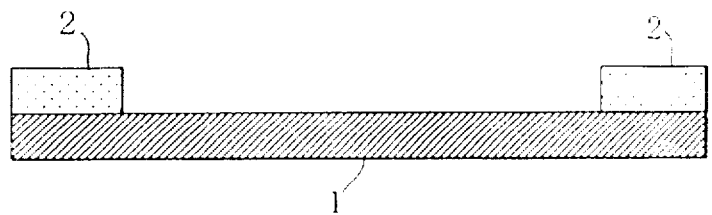
FIGS. 1a to 1f are cross-sectional views representing the production steps of a flexible circuit board according to an embodiment of the present invention.

In FIG. 1a, a resist layer 2, required for the formation of a desired circuit wiring pattern, is suitably formed on one side of a metal layer 1. Metal layer 1 may be comprised of a material, such as stainless steel or copper, which can be removed by chemical etching. Layer 2 is formed by coating layer 1 with a resist material, exposing to light and developing to thereby define a desired wiring pattern.

Figure 1B:
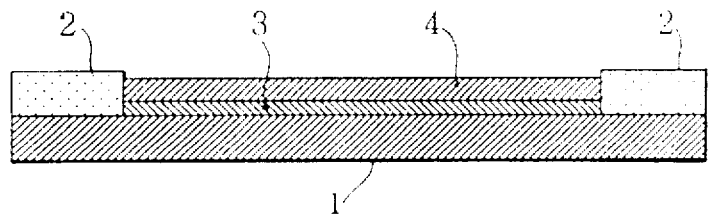

Thereafter, as shown in FIG. 1b, a conductive layer 3 is formed by plating metal layer 1 where exposed. Layer 3 will be comprised of a conductive metal, such as gold, having excellent corrosion resistance. Accordingly, layer 3 will not be removed by an etching solution applied to the exposed surface of the metal layer 1 as will be discussed below. Further, a circuit wiring layer 4 by plating conductive layer 3, i.e., the desired wiring pattern with a highly conductive material such as copper. Thus a circuit wiring pattern is constituted by conductive layer 3 and circuit wiring layer 4.

Figure 1C:
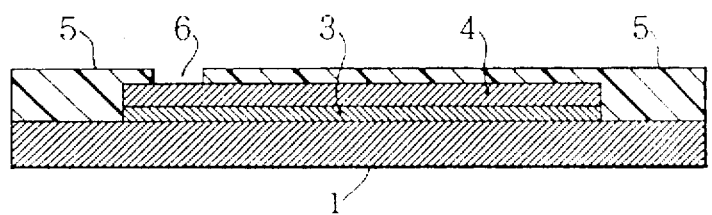

Then, as shown in FIG. 1c, after the resist layer 2 has been peeled off and removed, an insulating surface protective layer 5 is formed over the circuit wiring layer 4. At the same time, a hole 6 for exposing a predetermined portion of the circuit wiring layer 4 is formed. Surface protective layer 5 can be formed, together with hole 6, through a series of steps consisting of coating an appropriate photosensitive resin material, such as a photosensitive polyimide resin, exposing to light, developing, heating and the like.

Figure 1D:
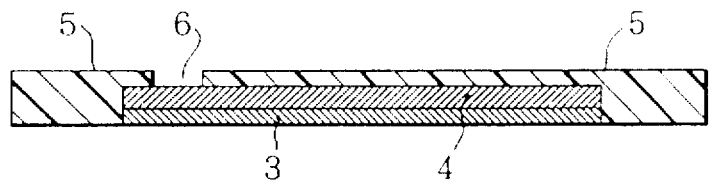
Figure 1E:
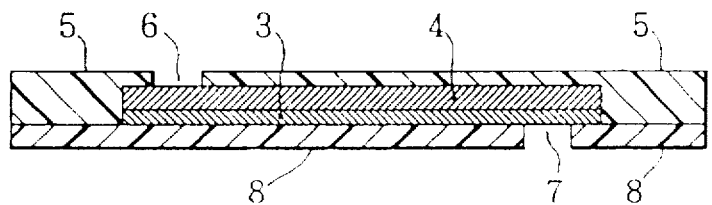

Thereafter, as shown in FIG. 1d, the metal layer 1, which is now unnecessary, is removed by etching. Next, as shown in FIG. 1e, another surface protective layer 8 is suitably formed from a photosensitive resin on the surface of the conductive layer 3 which is exposed by removal of layer 1. Protective layer 8 includes at least a first hole 7 through which a predetermined portion of the conductive layer 3 is exposed. Protective layer 8 is formed by the same technique as described above with respect to layer 5.

Owing to the above steps, exposed terminal portions for external connection can be arranged at the positions of the holes 6 and 7. Holes 6 and 7 can be formed finely at predetermined positions on both sides of the circuit wiring pattern constituted by the conductive layer 3 and the circuit wiring layer 4.

Figure 1F:
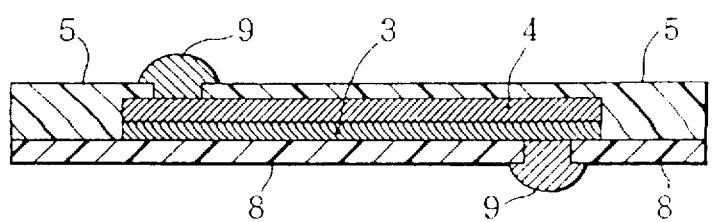
Figure 2A:
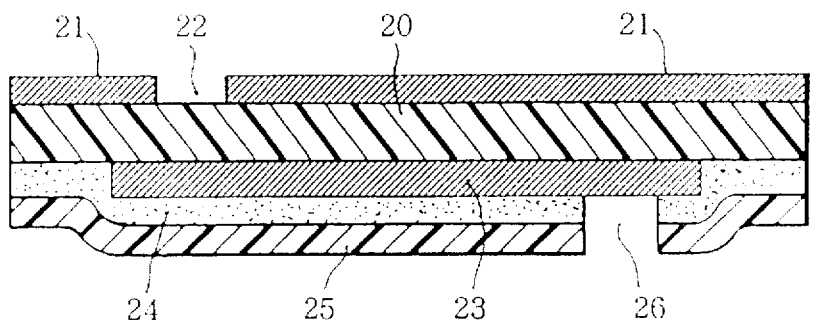
FIGS. 2a to 2d are cross-sectional views representing the production steps of a flexible circuit board according to the prior art.
Figure 2B:
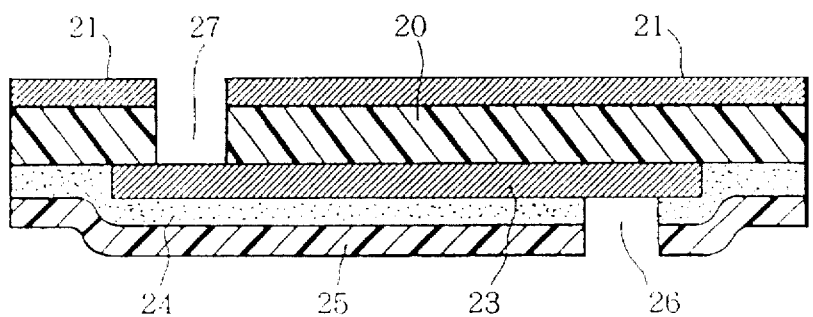
Figure 2C:
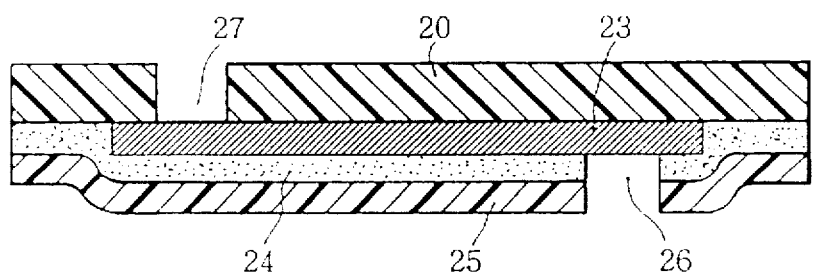
Figure 2D:
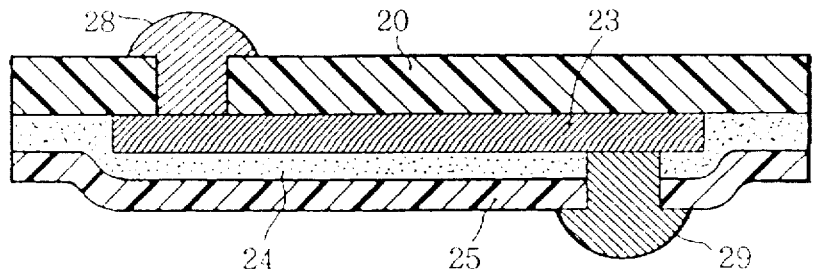

Further, as required, as shown in FIG. 1f, the step of filling a conductive material such as copper into the above holes 6 and 7 by plating means is employed to manufacture a flexible circuit board having bumps 9 first ends of which are electrically connected to the circuit wiring pattern and the other ends of which project toward outwardly beyond of the surface protective layers 5 and 8.

By employing the above technique, it is easy to constitute a flexible circuit board having external terminals which are precisely defined and in the form of lands located at the positions of the exposure holes 6 and 7 on the both sides of the circuit wiring pattern.

In the step of forming a circuit wiring pattern as shown in FIG. 1b, it is possible to constitute a circuit wiring pattern by the highly etch resistant conductive layer 3 only, i.e., without the conductive layer 4.

Likewise, it is possible to manufacture with ease a flexible circuit board having the above-described bumps, i.e., outwardly projecting terminals, at predetermined positions on both sides of a circuit wiring pattern which is constituted by the above highly resistant conductive layer 3 only.

According to the present invention, necessity for the use of an expensive double-side copper laminated sheet for the formation of a circuit wiring pattern, as in the prior art, is eliminated and it is possible to provide at a low cost a flexible circuit board having land-shaped external connection terminal portions or bumps which can be formed finely at predetermined positions on both sides of a circuit wiring pattern without employment of an expensive facility such as an excimer laser.

Further, according to the present invention, it is possible to form finely a desired circuit wiring pattern having a single-layer or multi-layer structure by plating means and to provide a high-function flexible circuit board having the above-described external connection terminal portions or bumps.

What is claimed is:

1. A method for producing a flexible circuit board comprising the steps of:

forming a resist layer which defines a desired wiring pattern on a first side of a metal layer;

plating a first layer of etch resistant conductive material on the surface of the first side of the metal layer, the first layer of conductive material having the configuration of the pattern defined by the resist layer whereby the first conductive layer forms an electrical circuit;

removing the resist layer;

forming a first surface protective layer over the first layer of conductive material, said first surface protective layer having at least a first hole through which a predetermined portion of the circuit formed by the first conductive layer is exposed;

removing the metal layer by etching;

forming a second surface protective layer over the side of the first conductive layer exposed by removing the metal layer, the second protective layer having at least a first hole through which a predetermined portion of the circuit formed by the first conductive layer is exposed; and forming exposed terminals on both sides of the circuit at the positions of the holes.

2. A method for producing a flexible circuit board according to claim 1, further comprising the step of providing a coating of a second conductive material on top of the first layer of etch resistant conductive material.

3. A method for producing a flexible circuit board according to claim 2, wherein the step of forming terminals includes forming external connection bumps which are electrically connected to the circuit, the bumps being produced by filling said holes in said surface protection layers by plating.

4. A method for producing a flexible circuit board according to claim 3 wherein the steps of forming the surface protective layers comprise applying a film of a photosensitive resin material by photolithography.

5. A method for producing a flexible circuit board according to claim 2, wherein the steps of forming the surface protective layers comprise applying a film of a photosensitive resin material by photolithography.

6. A method for producing a flexible circuit board according to claim 1, wherein the step of forming terminals includes forming external connection bumps which are electrically connected to the circuit, the bumps being produced by filling said holes in said surface protection layers by plating.

7. A method for producing a flexible circuit board according to claim 6, wherein the steps of forming the surface protective layers comprise applying a film of a photosensitive resin material by photolithography.

8. A method for producing a flexible circuit board according to claim 1, wherein the steps of forming the surface protective layers comprise applying a film of a photosensitive resin material by photolithography.

* * * * *